(12) United States Patent
Usenko et al.

(10) Patent No.: US 12,206,030 B2
(45) Date of Patent: Jan. 21, 2025

(54) STACKED DIODE WITH SIDE PASSIVATION AND METHOD OF MAKING THE SAME

(71) Applicants: THE CURATORS OF THE UNIVERSITY OF MISSOURI, Columbia, MO (US); Steven Bellinger, Manhattan, KS (US)

(72) Inventors: Alexander Usenko, Lake St. Louis, MO (US); Steven Bellinger, Manhattan, KS (US); Anthony Caruso, Overland Park, KS (US)

(73) Assignee: THE CURATORS OF THE UNIVERSITY OF MISSOURI, Columbia, MO (US)

( * ) Notice: Subject to any disclaimer, the term of this patent is extended or adjusted under 35 U.S.C. 154(b) by 172 days.

(21) Appl. No.: 17/946,022

(22) Filed: Sep. 15, 2022

(65) Prior Publication Data

US 2023/0086715 A1    Mar. 23, 2023

Related U.S. Application Data

(60) Provisional application No. 63/245,778, filed on Sep. 17, 2021.

(51) Int. Cl.
*H01L 29/861* (2006.01)
*H01L 29/66* (2006.01)

(52) U.S. Cl.
CPC .... *H01L 29/8613* (2013.01); *H01L 29/66121* (2013.01); *H01L 29/66136* (2013.01)

(58) Field of Classification Search
CPC ........... H01L 29/8613; H01L 29/66121; H01L 29/66136; H01L 21/30608; H01L 21/78; H01L 25/074; H01L 25/50; H01L 29/045; H01L 29/0657; H01L 29/167
See application file for complete search history.

(56) References Cited

U.S. PATENT DOCUMENTS

2021/0249519 A1\* 8/2021 Yao ................. H01L 29/66795
2023/0051845 A1\* 2/2023 Zollner ................. H01L 27/15

\* cited by examiner

*Primary Examiner* — Mohammad A Rahman
(74) *Attorney, Agent, or Firm* — Sandberg Phoenix & von Gontard, P.C.

(57) ABSTRACT

Process flow for a stacked power diode and design of the resulting diode is disclosed. Blanket epitaxy over heavy doped wafers is performed. By controlling dopant addition during epitaxy, desired n-type, diode base, and p-type doping profiles and thicknesses achieved. V-groove pattern if formed on wafers by depositing mask film, lithography and anisotropic etch. Islands surrounded by V-grooves define individual diodes. V-grooves serve as side insulation. Next, oxidation step passivates V-grooves. Further, the mask film is stripped to open diode contact areas on both sides of wafers. Next high melting point metal and low melting point metal films are selectively electroplated on all open silicon surfaces. Stacking is performed on wafer level by bonding of desired wafer count by solid-liquid interdiffusion process. Wafer stacks are sawed into individual stacked diode dies along outer slopes of V-grooves. Final stacked devices can be used as DSRD—drift step recovery diodes. Compared to DSRDs made by known methods, better fabrication yield and higher pulse power electrical performance is achieved.

22 Claims, 9 Drawing Sheets

STACKED DIODE WITH SIDE PASSIVATION AND METHOD OF MAKING THE SAME

CROSS-REFERENCE TO RELATED APPLICATIONS

This patent application claims priority to U.S. Provisional Patent Application Ser. No. 63/245,778. The benefit under 35 USC § 119(e) of the United States provisional application is hereby claimed, and the aforementioned provisional patent application is incorporated herein by reference.

This patent application was made with government support under contract number N68335-19-C-0255 awarded from the Office of Naval Research. The Government has certain rights in this invention.

TECHNICAL FIELD OF THE INVENTION

The invention relates generally to semiconductor processing, and. more particularly, to methods of making power semiconductor diodes for operating in pulsed mode.

BACKGROUND OF THE INVENTION

Semiconductor diodes can work in various modes depending on application requirements, for example, work as a part of a current rectifier circuit. Another diode application is forming short current/voltage pulses on a load. This operation mode of diodes was later called "step recovery" or "drift step recovery" mode.

Diodes with a design optimized for working in this mode are called DSRD—drift step recovery diodes. The term "SOS" is shorthand for 'semiconductor opening switches' and is also used in the field for quite similar diode designs, similar operating mode, just with different driving circuits. A "pulser", a generator having the same function as Marx generator, is further built using the DSRD/SOS. These semiconductor devices allow longer lifetime, faster repetition rates, smaller size, and like advantages over the Marx generators.

The pulse mode has imposed some specific requirements on diode design, and on the diode manufacturing process flow. Pulse generator circuits are typically designed to obtain very high voltages—from the kilovolt (kV) to the megavolt (mV) range. Silicon has $3\times10^5$ V/cm bulk electrical breakdown field. This means that to withstand 1 kV reverse bias the diode must have a depletion zone at least 33 microns thick (which is formed in low doped Si. In diode manufacturing, a safety margin is traditionally added to account for non-ideal diode design and process. Thus, to make 1 kV rated diode, the depletion zone is typically designed to be about 100 microns thick.

One reason why the triple safety margin is added is that the diode is not infinite in area, and it has side walls. Along the walls, the breakdown voltage is limited by silicon surface properties, not bulk properties. Particularly, surfaces have a higher carrier generation rate and are thus prone to higher avalanche multiplication. The weakest part of the diode is usually its periphery, for example the side surface of the diode. There are many approaches used in power semiconductor industry as to terminate and passivate the silicon surfaces and achieve the breakdown close to the bulk limit. Some use designs that widen the diode depleted zone width on surface as compared to bulk. For example, by beveling the side walls. Also, good passivation of Si surface bonds is required. The best passivation is achieved with thermal oxidation of the silicon surface. However, oxidation is typically prohibited as the diodes already have metal contacts, thus the structure cannot be heated to temperatures required by oxidation, typically above 750° C. Various diode side termination approaches have also been attempted.

FIG. 1A schematically illustrates that the weakest part of the diode (where the breakdown happens) are diode edges, surface intersecting p-n junctions, and diode base regions. It is especially true for a traditional diode process flow which uses dopants drive-in diffusion into silicon. FIG. 1A illustrates that to maximize the diode high voltage performance, two main issues have to be addressed: (1) depletion zone (diode base) width and (2) side termination and passivation.

The higher breakdown voltage can be also achieved by stacking of the individual diodes. This is illustrated by FIG. 1B. One can see that the diode stacking concept is copied from a traditional Marx generator design where many dielectric gaps are connected in series. This approach is extensively used in pulsed power semiconductor technology, such as by the assembling of the dies in stacks carried out by soldering followed by edge sealing with silicone compound. Both steps are not optimal. In soldering, an excess of the solder is pushed to diode sides and either causes electric shorts or at least, lowers the breakdown voltage. Another disadvantage of soldering process is forming voids in the solder layer. This causes non-uniform current flow across the diode, hot points, and eventual electrical failures of the DSRD stacks. Silicone provides good diffusion barrier against such infiltrants as outside moisture, but it does not passivate well dangling bonds of semiconductor surface. In silicon technology, the surface self-passivates by native oxide formation, thus adding just the diffusion barrier still has a positive effect.

Diode stacking can be performed in one of two ways. One can cut wafer with diodes into individual dies, then stack the dies. Alternately, one can stack wafers, then cut the wafer assembly into stacked dies. The first approach was favored in the known art. In the prior art, there were attempts of process integration where the diode stack is formed on wafer level, then cut into dies. This may be thought of as a stacking process by continuous growing of stack of p- and n-layers on initial silicon wafer by epitaxy. This approach has an advantage over older methods as the diode stack is grown on wafer in a single process step—epitaxy. Though, disadvantages of the process well overhit the advantages. First, thickness of epitaxy layer grown in one step is limited to about 100 microns. Thus, breakdown voltage is limited to below 1 kV no matter whether it is a single diode or a stack. Another crucial disadvantage of this process is that in the stack, heavily doped (degenerate) p-type silicon is grown right over degenerate n-type silicon. As epitaxy is a high temperature process, typically performed at about 1100° C. and simultaneously with epitaxy, diffusion of p-type dopant into n-doped Si, and diffusion of n-type dopant into p-doped Si, inevitably happens. This undesirable diffusion results in a compensated (semi-insulating) silicon in area where degenerate silicon is required. This is equal to adding a high parasitic serial electrical resistivity between each two neighboring diodes in a stack. Thus, eventual parasitic resistance is much higher compared to a simply soldered diodes.

Over the last several decades, DSRD/SOS are typically manufactured using diffusion of dopant. FIG. 1A gives a simplified illustration of the diode cross section. Requirement of thick depletion width can be satisfied by using high diffusion temperatures, long diffusion times, and dopants having high diffusion coefficients in silicon. Also, the wafer must be thinned before the diffusion considering that tails of p and n diffusion profiles should almost meet, thus the diode base region has ideally zero thickness. If the wafer is not properly thinned, the diode will have an excessively thick base region which will drastically degrade its pulse time performance—voltage rise time on a load. If overthinned, or over-diffused, the tails will overlap, and the diode will fail for breakdown voltage specs. By now, after decades of optimizing this traditional deep diffusion silicon technology, near all opportunities have been exhausted and further improvement in DSRD/SOS devices, such as lowering their switch time and increasing breakdown voltage, require new process integration solutions. The art would benefit from a method of manufacturing of silicon DSRD/SOS wafer level stacked devices that integrates improved diodes side termination and passivation methods. Thus, there remains a need for improved DSRD design and process to achieve breakdown voltages close to silicon bulk theoretical breakdown field. The present novel technology addresses this need.

SUMMARY OF THE INVENTION

Process flow for making stacked diodes with integrated steps of side termination and passivation comprises the following sequence.

(1) epitaxial grow of graded n and p layers over heavy doped wafer to form wafer size diode structure (2) etching V-grooves by anisotropic etch through a mask to define side termination surfaces of individual diodes (3) passivate the silicon surfaces by thermal oxidation (4) open diode upper silicon surface for electrical contact by chemical mechanical polishing of the thermal oxide (5) selective electroplating of high melting point metal over the opened silicon surfaces on top of wafer (6) stripping of oxide on back side of the wafer (7) blanket electroplating of high melting point metal over wafer backside (8) blanket electroplating of low melting point metal over high melting point metal on wafer backside (9) repeating steps 1-8 on number of wafers equal to number of diodes in a stack

(10) bonding of prepared wafers by assembling the wafers into a stack and heating above melting point of low melting point metal

(11) cutting the bonded wafer assembly along lines intersecting outer slopes of V-grooves.

Resulting DSRD stack with side termination and passivation is shown on FIG. 6.

As an example, 4-diodes stack is shown. More particularly, for making of stacks of silicon drift step recovery diodes (DSRD). Stacking increases voltage at which the device is capable to operate. Side passivation increases breakdown voltage of each diode in the stack. Invented is a process integration scheme combining both stacking and passivation.

DETAILED DESCRIPTION

Before the present methods, implementations, and systems are disclosed and described, it is to be understood that this invention is not limited to specific synthetic methods, specific components, implementation, or to particular compositions, and as such may, of course, vary. It is also to be understood that the terminology used herein is for the purpose of describing particular implementations only and is not intended to be limiting.

Figure 1A:
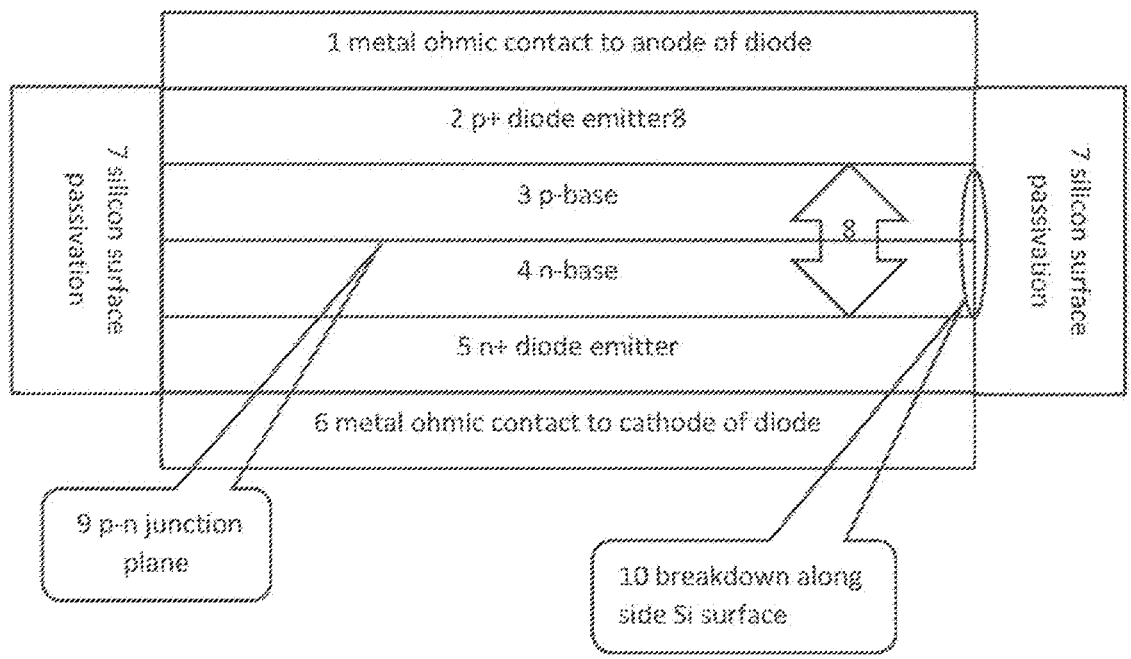
FIG. 1A shows a schematic cross-sectional view of a single PRIOR ART DSRD die.
Figure 1B:
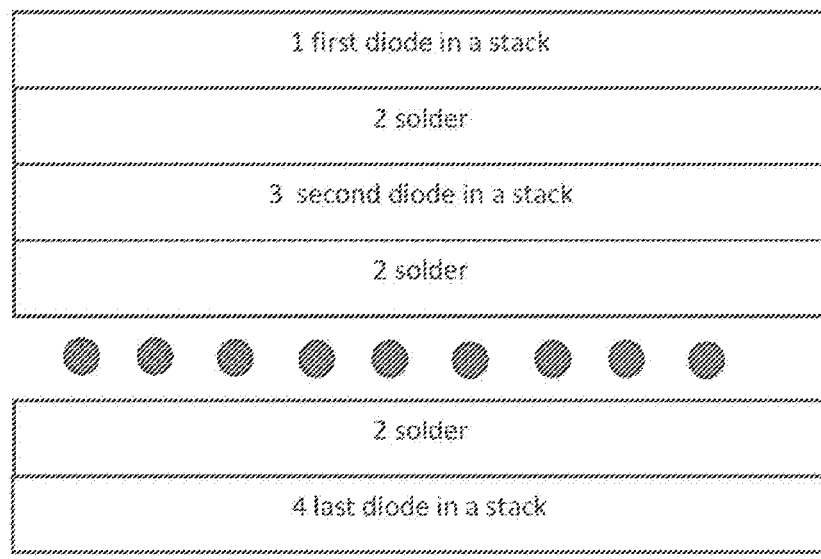
FIG. 1B shows a schematic view of a PRIOR ART stacked DSRD die.
Figure 2:
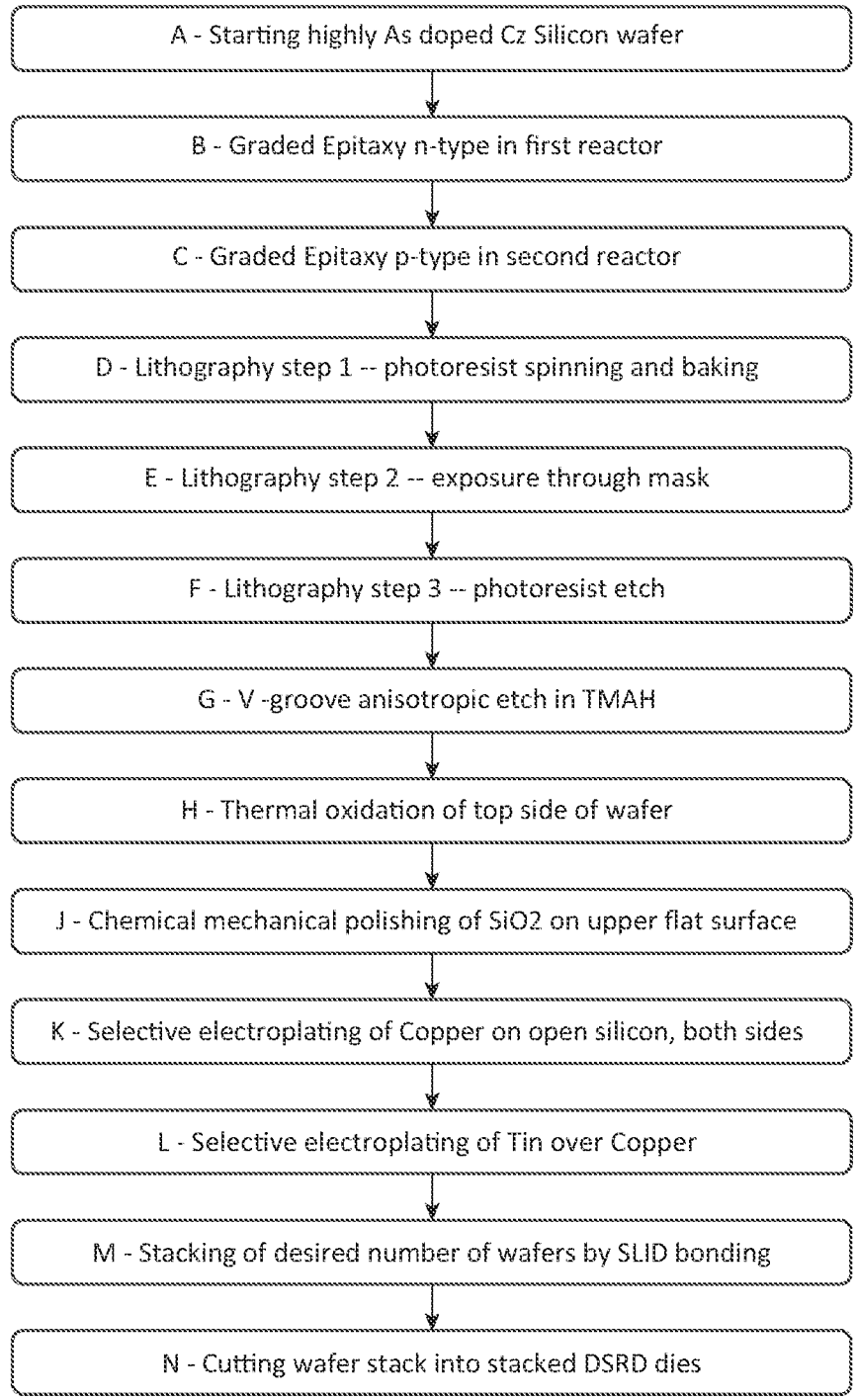
FIG. 2 schematically shows DSRD process flow according to a first embodiment of the present invention.
Figure 3A:
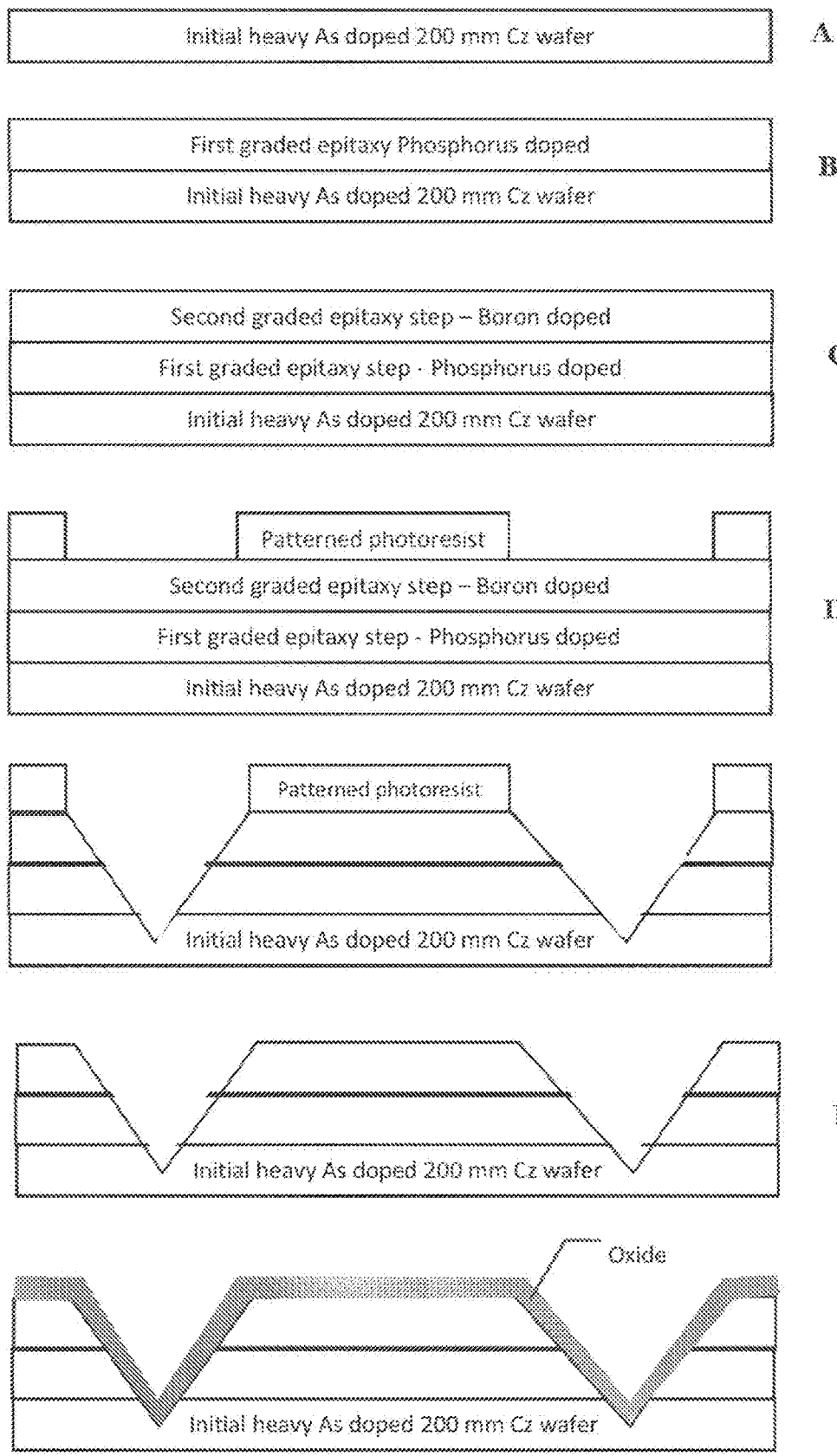
FIG. 3A schematically shows cross sections of semiconductor structures obtained at progressing steps of process flow according to the embodiment of FIG. 2.
Figure 3B:
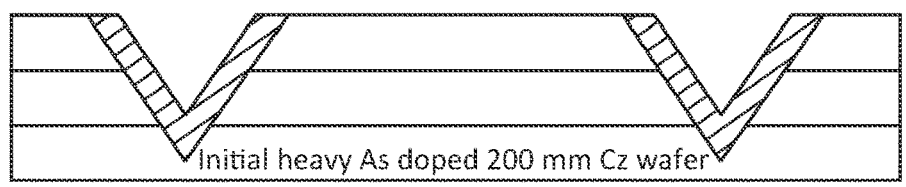
FIG. 3B show continuation of FIG. 3A.
Figure 3B:
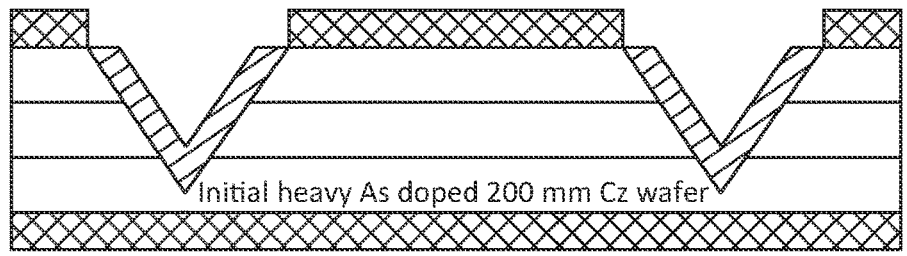
Figure 3B:
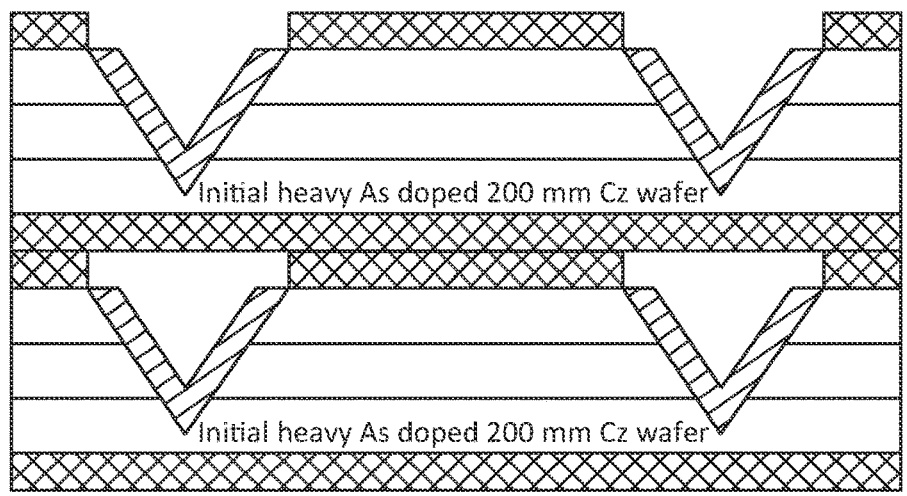
Figure 3B:
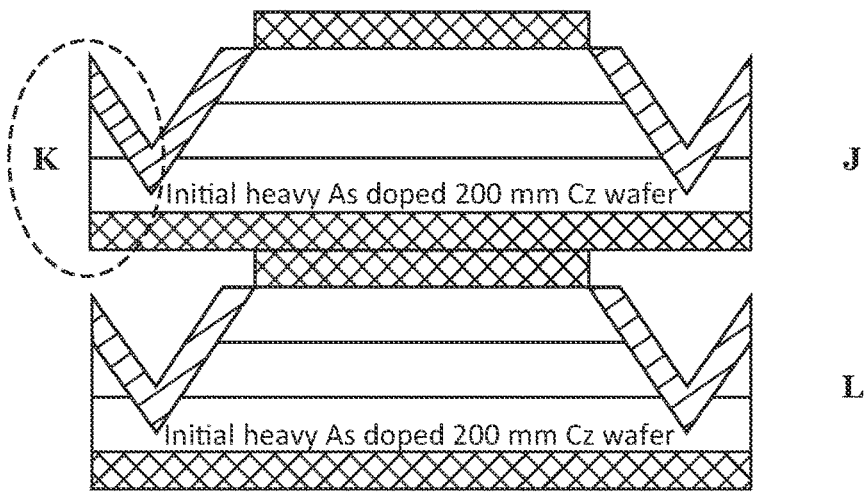
Figure 4A:
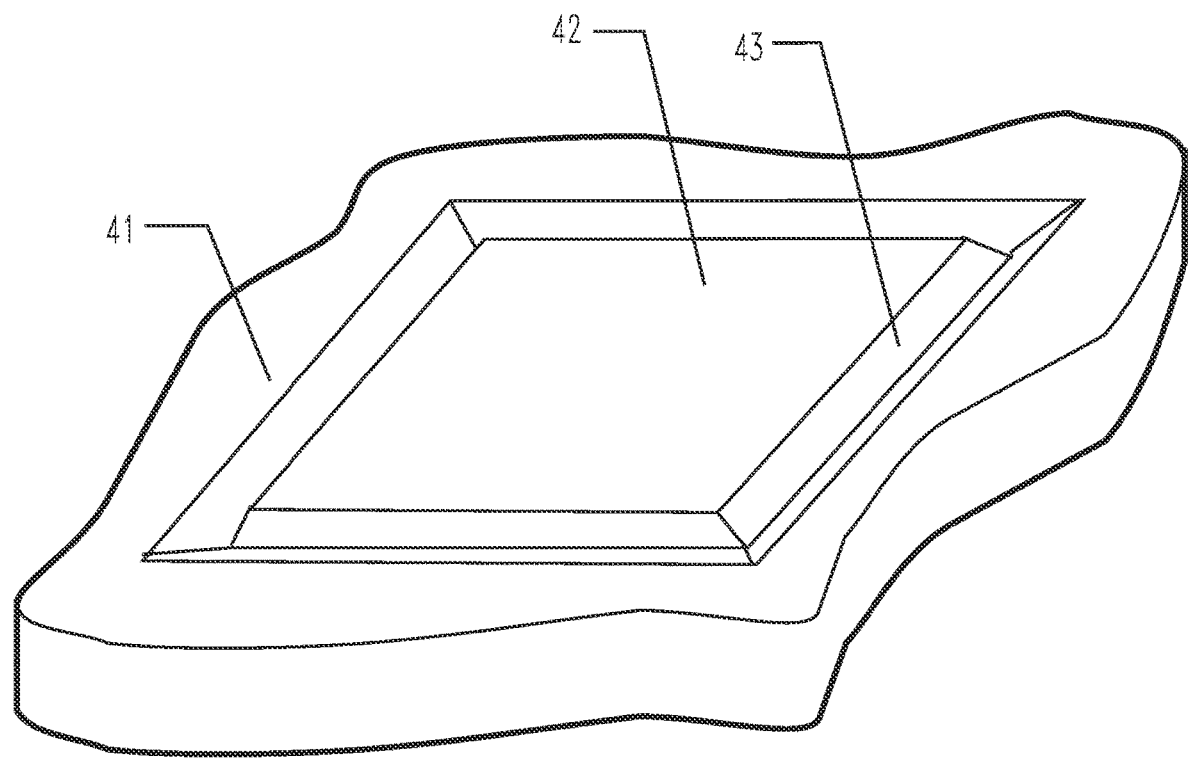
FIG. 4A shows a 3D illustration of V-groove design surrounding an individual diode die.
Figure 4B:
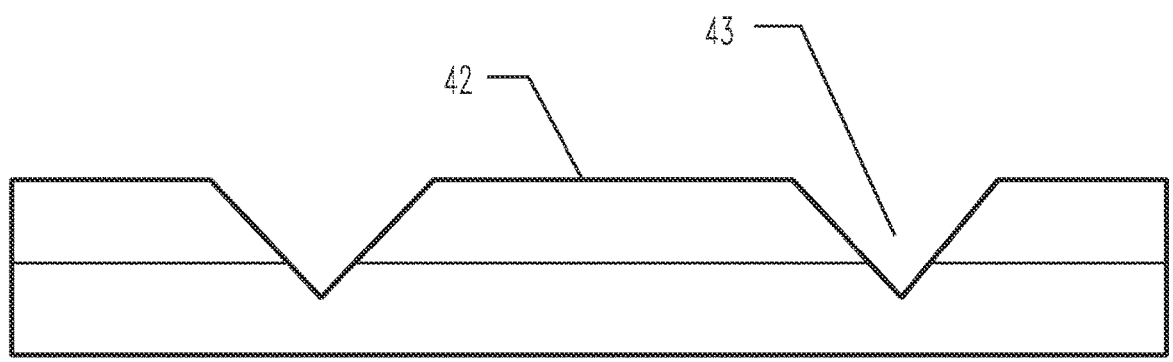
FIG. 4B illustrate the V-groove design in cross section.
Figure 5A:
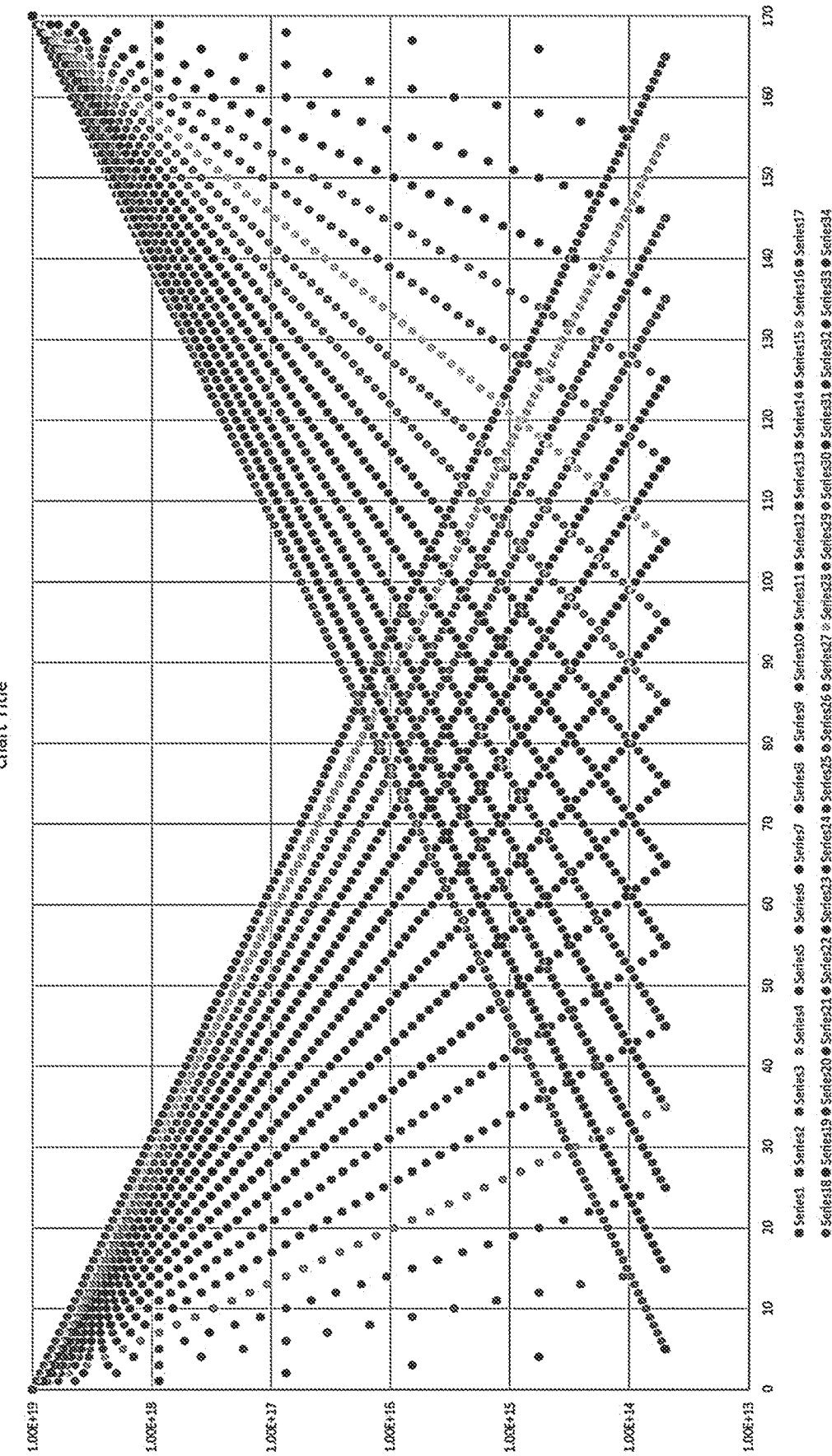
FIGS. 5A-5C illustrate options in choosing doping profiles of the diodes.
Figure 5B:
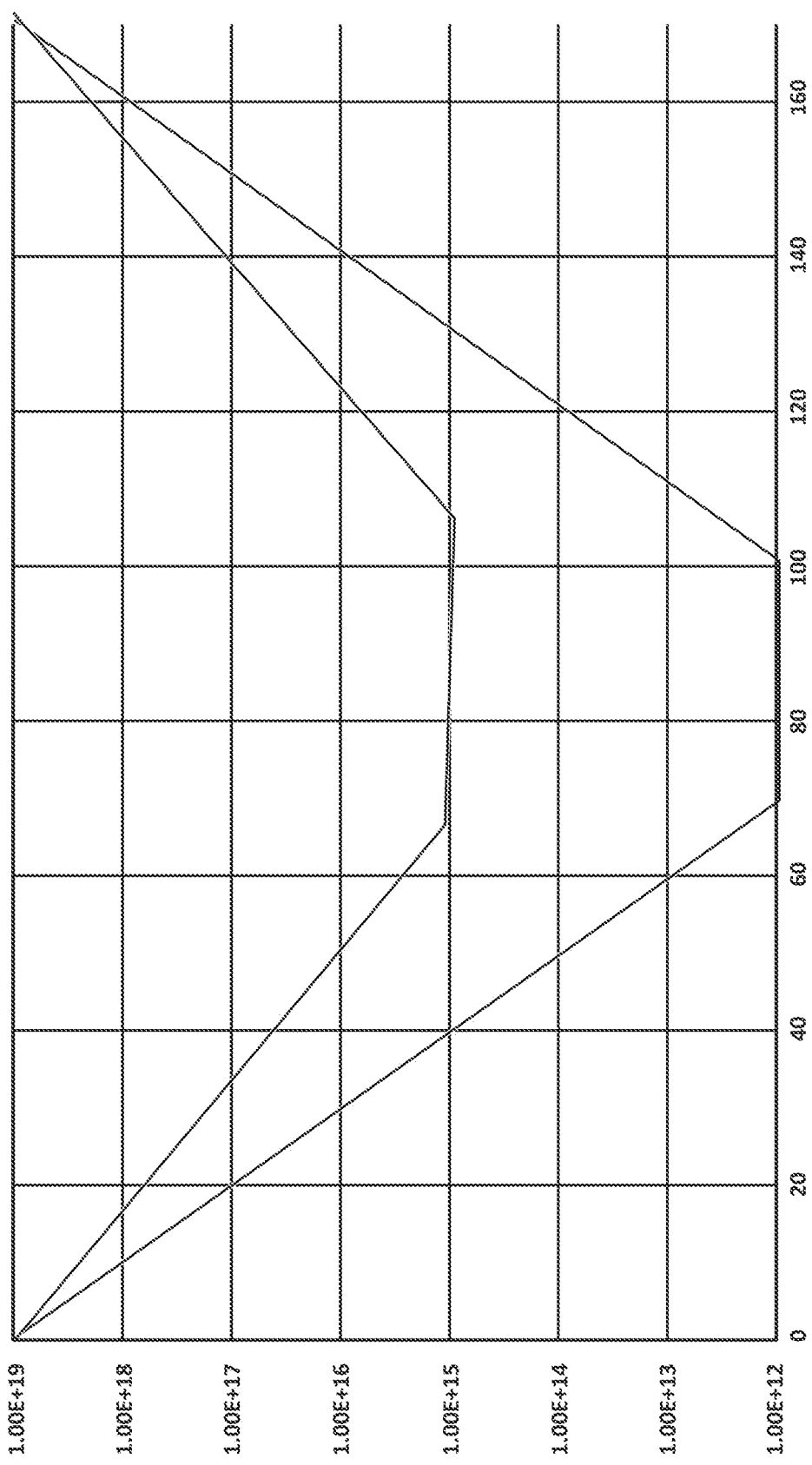
Figure 5C:
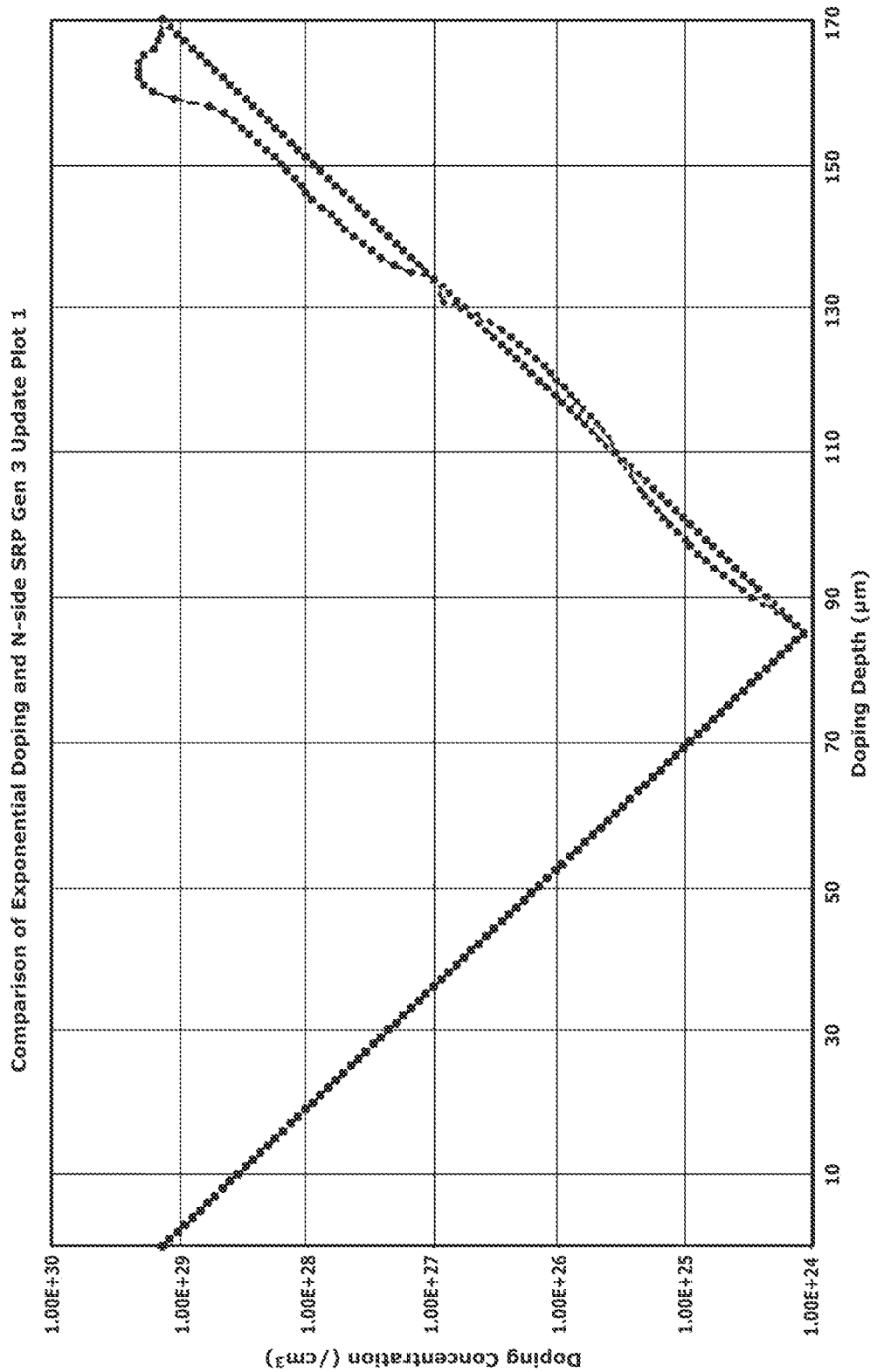
Figure 6:
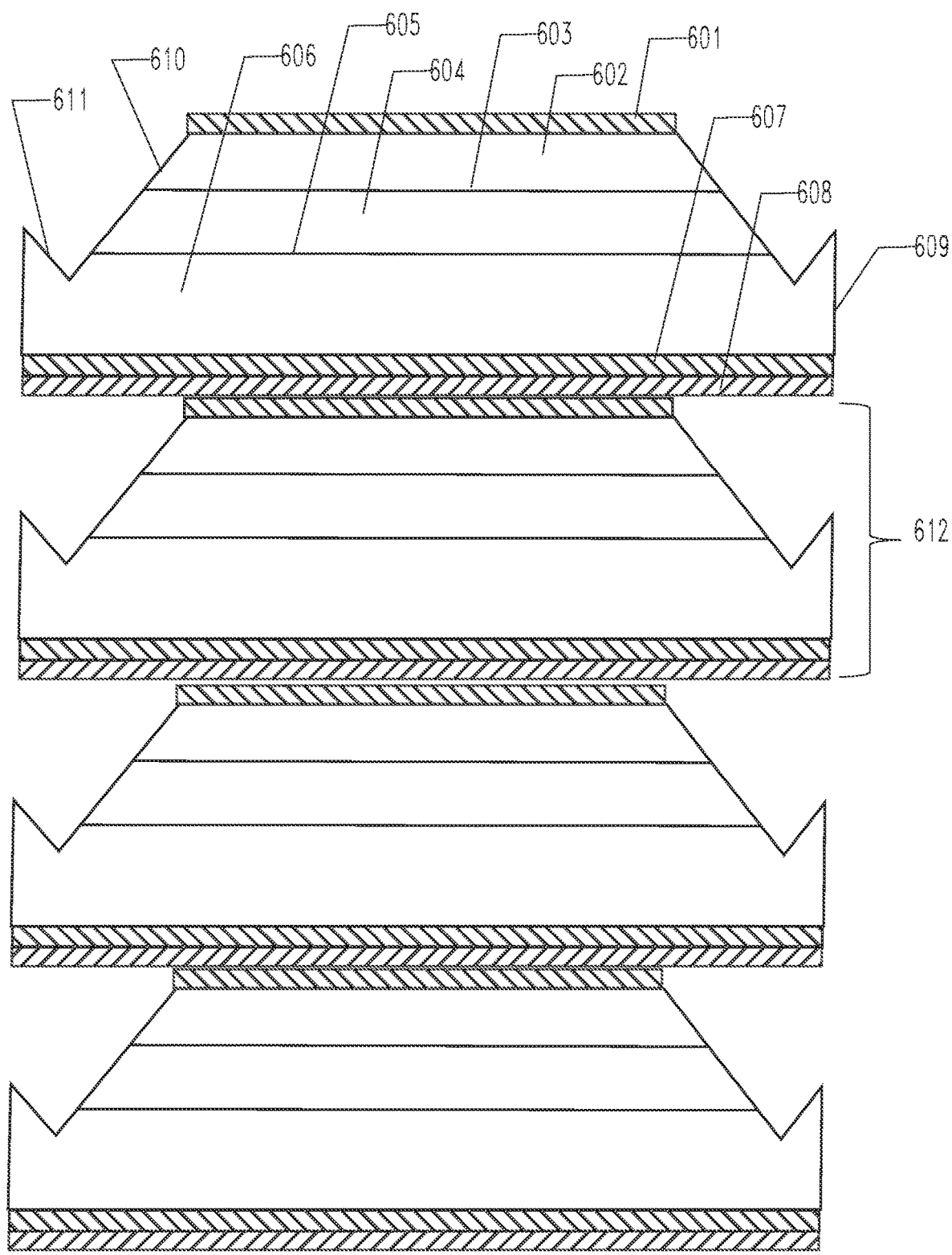
FIG. 6 schematically illustrates a cross section of individual stacked diodes obtained by the inventive process.

As seen in drawing FIGS. 3A-6, the present invention relates to a stacked DSRD with side termination and passivation as built by the following process flow. A heavy doped initial wafer is chosen to serve as a current conductor to the diode; therefore, the doping level is selected to keep Si degenerate, typically $1 \times 10^{19}$ cm-3 or higher, but still below As solubility limit in Si so as to maintain a defect free Si surface. An arsenic doped wafer can be used because As has about the same atomic size as silicon, thus minimizing defects in epitaxial layer due to difference in lattice constants between the substrate and the epi layer. This is useful here, as a relatively thick epitaxial film is to be grown. Wafers grown by the standard Czochralski (Cz) method are used, preferably with high oxygen content of at least about 20 parts per million atoms (ppma). Both oxygen and arsenic will further serve as internal getters that scavenge metal and other contaminations brought by this and further processing steps. Therefore, high concentrations of both are desired. Notice, in processes known in the art, use of internal getters is not possible, as the prior art is limited to the use of float zone (FZ) wafers; so the prior art process flow is very sensitive to contaminations during manufacturing. Oxygen here plays an additional positive role, as oxygen precipitates serve as dislocation lockers and thus the instant wafers are much more mechanically robust compared to FZ wafers known in the art. The instant wafers do not develop defects as slips upon high temperature processing steps.

The wafer is then loaded into an epitaxial reactor. A regular epitaxial process recipe is used. First, a hydrogen bake is performed to remove native oxide and additionally smoothen the wafer surface. Typically, a first epitaxial layer (such as an n-type layer) is grown in a first reactor using a first (n-type) dopant, and then a second epitaxial layer (such as a p-type layer) is grown thereupon in a second reactor using a second (p-type) dopant.

In particular, the n-type layer may be grown having a gradually decreasing concentration of n-type dopant (such as As) thereacross; such a gradient may be linear or may have any desired exponential curvature. The starting concentration may equal that of any desired doping level, such as the doping level of the initial wafer upon which the epitaxial layer is deposited, and may decrease to any arbitrary doping concentration, including zero. Likewise, the p-type layer may begin at a predetermined low concentration, such as zero, and gradually increase the concentration of p-type dopant (such as B) to some predetermined desired concentration level, such as from $5 \times 10^{18}/cm^3$ and $5 \times 10^{19}/cm^3$; again, such a gradient may be linear or may have any desired exponential curvature. Such epitaxial layers are typically from 1 micron to 100 microns thick.

Next, the chamber temperature is lowered to a predetermined grow temperature, and the reactor chamber is fed by trichlorosilane and phosphine added to a hydrogen carrier gas. Next, the dopant (phosphine) flow is gradually lowered to obtain a predetermined, desired doping profile.

In the instant technology, stacking wafers first is the preferable method as it replaces many individual/manual operations by a batch processing, thus improving manufacturability, decreasing costs, and the like.

In operation, stacked semiconductor diode may be produced by the method including an initial preparation of heavy doped silicon <100> wafers (such as having an As content between $5 \times 10^{18}/cm^3$ and $5 \times 10^{19}/cm^3$) for growth of lower doped layers thereupon, with each wafer typically grown according to the Cz process with an oxygen content between 10 ppma and 20 ppma. Blanket n-doped and p-doped layers are sequentially grown on said wafers, such as by epitaxy. Mesas are then formed defining individual diodes where mesa slopes terminate diode sides, such as by etching through apertures (windows) in a mask in TMAH solution. The mask may be any convenient material, such as LPCVD deposited silicon nitride film or the like. Typically, such windows (and thus the mesas) have a width of 10 microns to 500 microns. In some embodiments, the windows have the shape of 'square bagels', with the sides oriented along low crystallographic indices of the silicon wafer, with one parallel and another perpendicular to the wafer flat or notch. The width of a given window is typically in excess of 1.4 times the total thickness of the epitaxial layers, and is smaller than the wafer plus epitaxial layers.

Electrically conducting layers are deposited on both sides of the wafer. Such deposition of electrically conducting layers may be accomplished by a two-step process, such as selective metal electroplating on a non-dielectric surface. Typically, such deposition involves the deposition of a high melting point metal (such as copper) followed by the deposition of a lower melting point metal (such as tin) thereover. In this example, the copper layer is at least about three times as thick as the tin layer. The process is repeated to yield a plurality of wafers. Multiple wafers are then stacked and aligned to yield a predetermined, stack having a desired number of wafers for bonding. Next, the wafers defining the stack are bonded together to achieve electrical contact, and the bonded wafer stack is then cut into diode stacks. The side silicon surfaces of each respective diode stack is passivated to yield side termination surfaces. Typically, passivation is performed immediately after forming the mesas, wherein the mesas are formed by anisotropic etching of silicon through a mask by forming V-grooves, where the inner sides of each respective V-groove serves as side termination surfaces of each respective diode. Passivation may be accomplished by thermal oxidation after the etch.

Typically, the blanket n-doped and p-doped epitaxy layers are grown to have defined grading functions.

Typically, the cutting of each respective bonded wafer stack is performed along lines intersecting outer sides of the v-grooves.

Some advantages of the inventive process over the prior art convey in the diode design and include the following. First, the breakout voltage of each of the diodes in the stack is close to the bulk silicon breakdown voltage. This is due to termination surface design with a negative beveled surface <111>. In the known art, mesas are formed to terminate the side surfaces, such as by isotropic silicon etch in HNA. The HNA etch is a catalytic process, thus it is not well controlled.

Thus, mesa sizes and angles are nonuniform and have significant distributions. In the instant process, the mesa is formed by an anisotropic etch. The silicon crystal anisotropy gives rise to a high ratio of etch rate above 100:1 for orientations different from <111>. Thus, the silicon surface is faceted by the slowest etch rate surface. It is also the highest atomic density plane and therefore has the highest electrical breakdown value. This process is extensively used in bulk MEMS technology, but has not been applied so far for side mesa termination of power silicon devices.

While the claimed technology has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the claimed technology are desired to be protected.

What is claimed is:

1. A method of making a stacked semiconductor diode comprising:
  a) preparing initial heavy doped silicon <100> wafers for the growth of lower doped layers thereupon;
  b) sequentially epitaxially growing alternating blanket n-doped and p-doped layers on the initial heavy doped silicon <100> wafers thus yielding wafer-sized diode structures;
  c) forming a plurality of side terminating mesas on each wafer-sized diode structure defining individual diodes, wherein each respective side terminating mesa slopes to terminate diode sides;
  d) depositing electrically conducting layers on both sides of each respective wafer-sized diode structure having the plurality of side terminating mesas formed therein;
  e) stacking a predetermined number of the wafer-sized diode structures having the plurality of side terminating mesas formed therein and the electrically conducting layers deposited on both sides to yield a wafer stack;
  f) aligning the wafer stack for bonding;
  g) bonding the respective wafer-sized diode structures in the wafer stack together to achieve electrical contact and yield a bonded wafer stack;
  h) cutting the bonded wafer stack into a plurality of diode stacks;
  i) passivating side silicon surfaces of each respective diode stack;
  wherein passivation is performed immediately after forming each respective side terminating mesa;
  wherein the respective blanket n-doped and p-doped epitaxy layers have defined grading functionality;
  wherein each respective side terminating mesa is formed by anisotropic etch of silicon through a mask by forming V-grooves;
  wherein each respective V-groove has an inner side serving as a diode side termination surface; and
  wherein the cutting of the bonded wafer stack is performed along lines intersecting outer sides of V-grooves.

2. The method of claim 1 wherein the initial heavy doped silicon <100> wafers are arsenic doped to yield an arsenic content from $5 \times 10^{18}$ to $5 \times 10^{19}$ cm$-3$.

3. The method of claim 2 wherein wafers are grown by the Czochralski method to yield an oxygen content of between 10 ppma and 20 ppma.

4. The method of claim 1 wherein epitaxially growing respective alternating blanket n-doped and p-doped layers on the initial heavy doped silicon <100> wafers is a two-step process, with a first step performed in a first epitaxial reactor with a first dopant added, and a second step performed in a second epitaxial reactor with a second dopant added.

5. The method of claim 4 wherein the first step is growing an n-layer with gradually decreasing dopant concentration starting from concentration equal to doping level of initial wafer and ending with zero dopant added to reactor feeding gas flow.

6. The method of claim 5 wherein the first dopant is phosphorus.

7. The method of claim 4 wherein the gradually decreasing first dopant concentration follows an exponential function across grown layer thickness.

8. The method of claim 4 wherein the second step is growing a p-layer with gradually increasing dopant concentration starting from zero dopant added to reactor feeding gas flow and ending with dopant additive resulting in doping level in range from $5 \times 10^{18}$ cm−3 to $5 \times 10^{19}$ cm−3.

9. The method of claim 8 wherein the second dopant is boron.

10. The method of claim 8 wherein increasing the second dopant concentration follows an exponential function across grown layer thickness.

11. The method of claim 4 wherein each respective alternating blanket n-doped and p-doped layer is between 1 micron thick to 100 microns thick.

12. The method of claim 1 wherein respective side terminating mesas surrounding individual diodes are formed by etching through windows in a mask in TMAH solution.

13. The method of claim 12 wherein each respective window has a width from 10 microns to 500 microns.

14. The method of claim 13 wherein each respective window has a square bagel shape with sides oriented along low crystallographic indexes of silicon.

15. The method of claim 12 wherein the width of each respective window exceeds 1.4 of total thickness of the epitaxial layers but is less than total thickness of a respective initial wafer together with epitaxial layers.

16. Then method of claim 1 wherein the mask is silicon nitride film deposited by LPCVD.

17. The method of claim 1 wherein passivation comprises thermal oxidation immediately after anisotropic etch.

18. The method of claim 1 wherein deposition of electrically conductive layer comprises 2-step metal deposition.

19. The method of claim 18 wherein deposition comprises selective metal electroplating on non-dielectric surfaces.

20. The method of claim 19 wherein deposition comprises deposition of high melting point metal followed by deposition of low melting point metal.

21. The method of claim 20 wherein the high melting point metal is copper and the and low melting point metal is tin.

22. The method of claim 21 wherein the ratio of thicknesses of copper to tin exceeds 3:1.

\* \* \* \* \*